United States Patent
Stoddart et al.

(10) Patent No.: US 11,775,709 B2
(45) Date of Patent: Oct. 3, 2023

(54) TECHNIQUES FOR GENERATING COMPREHENSIVE INFORMATION MODELS FOR AUTOMOBILE DESIGNS

(71) Applicant: AUTODESK, INC., San Francisco, CA (US)

(72) Inventors: James Stoddart, New York, NY (US); David Benjamin, New York, NY (US); Danil Nagy, New York, NY (US); Damon Lau, New York, NY (US); Daniel Noviello, London (GB)

(73) Assignee: AUTODESK, INC., San Francisco, CA (US)

( * ) Notice: Subject to any disclaimer, the term of this patent is extended or adjusted under 35 U.S.C. 154(b) by 0 days.

(21) Appl. No.: 16/387,526

(22) Filed: Apr. 17, 2019

(65) Prior Publication Data

US 2019/0347376 A1 Nov. 14, 2019

Related U.S. Application Data

(60) Provisional application No. 62/668,734, filed on May 8, 2018.

(51) Int. Cl.
*G06F 30/23* (2020.01)
*G06F 30/15* (2020.01)
(Continued)

(52) U.S. Cl.
CPC .............. *G06F 30/23* (2020.01); *G06F 30/15* (2020.01); *G06T 19/00* (2013.01); *G06T 2210/36* (2013.01)

(58) Field of Classification Search
None
See application file for complete search history.

(56) References Cited

U.S. PATENT DOCUMENTS

2006/0173601 A1* 8/2006 Bassiere .............. B60W 50/08
701/53
2007/0288210 A1* 12/2007 Powell ................... G06T 17/20
703/2

(Continued)

FOREIGN PATENT DOCUMENTS

WO WO-2022265628 A1 * 12/2022

OTHER PUBLICATIONS

Patrick Rossbacher, Mario Hirz, Flexible parameterization strategies in automotive 3D vehicle layout, Computer-Aided Design and Applications, 2017, 14:5, p. 549-562, DOI: 10.1080/16864360.2016. 1273575 (Year: 2017).*

(Continued)

*Primary Examiner* — Michael J Cobb
(74) *Attorney, Agent, or Firm* — Artegis Law Group, LLP

(57) ABSTRACT

In various embodiments, an automobile modeling application generates automobile designs. In operation, the automobile modeling application determines a first parameter value associated with a first instance of a first parameterized automobile component. The automobile modeling application then computes a second parameter value associated with a second instance of a second parameterized automobile component based on a structural relationship between the first instance and the second instance. Subsequently, the automobile modeling application generates a computer-aided design (CAD) geometry model for an automobile based on the first parameter value, the second parameter value, and one or more functional relationships defined between two or more instances included in a set of parameterized automobile component instances. Advantageously, because the automobile modeling application automatically propagates changes throughout the automobile design, the amount of time required to make significant changes to the automobile design can be substantially reduced.

20 Claims, 4 Drawing Sheets

(51) Int. Cl.
*G06T 19/00* (2011.01)
*G06T 17/00* (2006.01)

(56) References Cited

U.S. PATENT DOCUMENTS

| | | | | |
|---|---|---|---|---|
| 2008/0312880 | A1* | 12/2008 | McLuckie | G06F 30/23 |
| | | | | 703/1 |
| 2010/0030525 | A1* | 2/2010 | Dong | G06F 30/15 |
| | | | | 703/1 |
| 2013/0013993 | A1* | 1/2013 | Oh | G06F 30/20 |
| | | | | 715/212 |
| 2013/0110573 | A1* | 5/2013 | Pye | G06Q 10/06 |
| | | | | 705/7.23 |
| 2015/0025854 | A1* | 1/2015 | Martinez Canedo | |
| | | | | G06T 17/005 |
| | | | | 703/1 |
| 2015/0347467 | A1* | 12/2015 | Basson | G06F 16/245 |
| | | | | 707/769 |
| 2016/0291959 | A1* | 10/2016 | Searle | H04L 63/10 |
| 2016/0357895 | A1* | 12/2016 | Hyde | G06F 30/20 |
| 2019/0179977 | A1* | 6/2019 | Van der Velden | G06F 30/23 |
| 2019/0347373 | A1 | 11/2019 | Benjamin et al. | |
| 2019/0347381 | A1 | 11/2019 | Benjamin et al. | |
| 2019/0347382 | A1 | 11/2019 | Stoddart et al. | |
| 2019/0370420 | A1* | 12/2019 | Feng | G06F 30/20 |
| 2020/0082036 | A1* | 3/2020 | Saito | G06F 30/15 |
| 2022/0318591 | A1* | 10/2022 | Haderbache | G06F 30/23 |

OTHER PUBLICATIONS

Oliver Konig, Marc Wintermantel, CAD-based evolutionary design optimization with CATIA V5, 2004, In Dynardo GmbH, editor, Weimarer Optimierungs—und Stochastiktage 1.0, p. 1-30 (Year: 2004).*

William E. Brock, Design Optimization Using CAD Parameterization Through CAPRI, 2011, Thesis, University of Tennessee, Chattanooga, Chattanooga, TN, p. 1-46 (Year: 2011).*

Mustufa H. Abidi, Abdulrahman Al-Ahmari, Ali Ahmad, A Systematic Approach to Parameter Selection for CAD-Virtual Reality Data Translation Using Response Surface Methodology and MOGA-II, 2018, PLoS ONE 13:(5): e0197673. p. 1-19, https://doi.org/10.1371/journal.pone.0197673 (Year: 2018).*

Ryan C.C. Chin, Product Grammar: Constructing and Exploring Solution Spaces, 2000, Thesis, Massachusetts Institute of Technology, Cambridge, MA, pp. 3-75 (Year: 2000).*

MSC Software, Adams Multibody Dynamics for Functional Virtual Prototyping, 2012, retrieved "https://www.mscsoftware.com/submitted-content/resources/br_adams_ltr_w.pdf", Accessed Aug. 13, 2021 (Year: 2012).*

Designtech, Parametric Modeling, 2021, retrieved "https://www.designtechsys.com/articles/parametric-modelling", Accessed Aug. 14, 2021 (Year: 2021).*

Mihalis Yannakakis, "Hierarchical State Machines", 2000, IFIP TCS 2000, LNCS 1872:315-330 (Year: 2000).*

Adams, "Adams/Car Training Guide", 2001, Adams/Car Training Guide, Version 11.0 (Year: 2001).*

MSC Adams, "Adams/Rail", 2002, MSC Adams Product Guide, retrieved from "https://www.mscsoftware.com/assets/1708_ADM6_02DAT_RAIL_CIN_r4.pdf" (Year: 2002).*

MSC Software Solutions, "MSC Software Solutions", 2019, Hexagon/MSC Software (Year: 2019).*

MSC Apex 2021—Online Help (HTML), "Dynamic Scenario", 2021, retrieved from "https://help.mscsoftware.com/bundle/apex_2021/page/node/2212.html" (Year: 2021).*

Ryan CC Chin, "Product Grammar: Constructing and Mapping Solution Spaces," 2004, Master of Science Thesis Massachusetts Institute of Technology, Cambridge, MA (Year: 2004).*

* cited by examiner

TECHNIQUES FOR GENERATING COMPREHENSIVE INFORMATION MODELS FOR AUTOMOBILE DESIGNS

CROSS-REFERENCE TO RELATED APPLICATIONS

This application claims priority benefit of the United States Provisional Patent Application titled, "TECHNIQUES FOR GENERATING INTEGRATED SYSTEM INFORMATION MODELS FOR AUTOMOBILE DESIGNS," filed on May 8, 2018 and having Ser. No. 62/668,734. The subject matter of this related application is hereby incorporated herein by reference.

BACKGROUND

Field of the Various Embodiments

Embodiments of the present invention relate generally to computer science and automotive technology and, more specifically, to techniques for generating comprehensive information models for automobile designs.

Description of the Related Art

A typical design process for an automobile may entail generating computer-aided design ("CAD") geometry models for different components of the automobile using product lifecycle management ("PLM") software. The PLM software facilitates the process of developing complex automobile designs to the point of manufacturability by, among other things, allowing different design teams to exchange CAD geometry models of different automobile components throughout the design process. Conventionally, each CAD geometry model is a high-resolution model of a given automobile component that ultimately includes the information necessary to manufacture the automobile component. In many use cases, a different design team is responsible for each different automobile component, so there usually are numerous design teams that need to share the CAD geometry models during the design process. Ultimately, the constituent CAD geometry models are assembled together to generate an overall CAD geometry model for the automobile that is subsequently used to manufacture the automobile.

One drawback to the above design process is that PLM software and CAD geometry models typically do not include ancillary design information, such as how the different automobile components functionally interact with one another. For example, if a component that radiates heat were to be moved closer to a heat-sensitive component, then the overall performance of the automobile could be inadvertently reduced. Consequently, the automobile design process necessarily relies on the expertise and manual interactions of the different design teams to identify and address the potential repercussions of each design change in a coordinated fashion. Identifying and addressing the repercussions of a significant design change can result in many design teams having to iteratively update and share their respective CAD geometry models and related information and expertise. Because the time needed to make significant design changes can oftentimes exceed the time remaining in the relevant design budgets, designers sometimes avoid such changes, thereby foregoing opportunities to optimize automobile performance, increase fuel efficiency, reduce overall size, etc. In these types of cases, the overall quality of automobile designs and the automobiles manufactured based on those designs is reduced.

For example, to modify an existing design for an vehicle having an internal combustion engine to generate a new design for a hybrid vehicle having an electric motor, designers could manually redesign the powertrain. The updates could involve a significant reduction in the size of the internal combustion engine used in the hybrid vehicle. However, because of the additional time and effort required to manipulate the different automobile components surrounding the internal combustion engine to account for the smaller sized engine, the relevant design teams could agree to create a superfluous void space around the smaller sized engine. Creating the void space would reduce or eliminate the impact of the smaller sized engine on the surrounding automobile components, but such a "fix" also could preclude opportunities to reduce the size of the hybrid vehicle and improve the overall quality of the hybrid vehicle design.

As the foregoing illustrates, what is needed in the art are more effective techniques for designing automobiles.

SUMMARY

One embodiment of the present invention sets forth a computer-implemented method for designing automobiles. The method includes determining a first parameter value associated with a first instance of a first parameterized automobile component; computing a second parameter value associated with a second instance of a second parameterized automobile component based on a structural relationship between the first instance and the second instance; and generating a computer-aided design (CAD) geometry model for an automobile based on the first parameter value, the second parameter value, and one or more functional relationships defined between two or more instances included in a set of parameterized automobile component instances.

At least one technical advantage of the disclosed techniques relative to the prior art is that, with the disclosed techniques, an automobile design is hierarchically defined using parameterized components that are interrelated to one another, both structurally and functionally. With the disclosed techniques, any change to any component is automatically propagated to any instance of that same component or to any other component impacted by the change. Because changes are automatically propagated throughout the automobile design, the amount of time required to make significant changes to the automobile design can be substantially reduced. As a result, designers are more likely to make significant changes to the designs of automobile components during the design process, which increases overall quality of the automobile design. These technical advantages represent one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive con

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
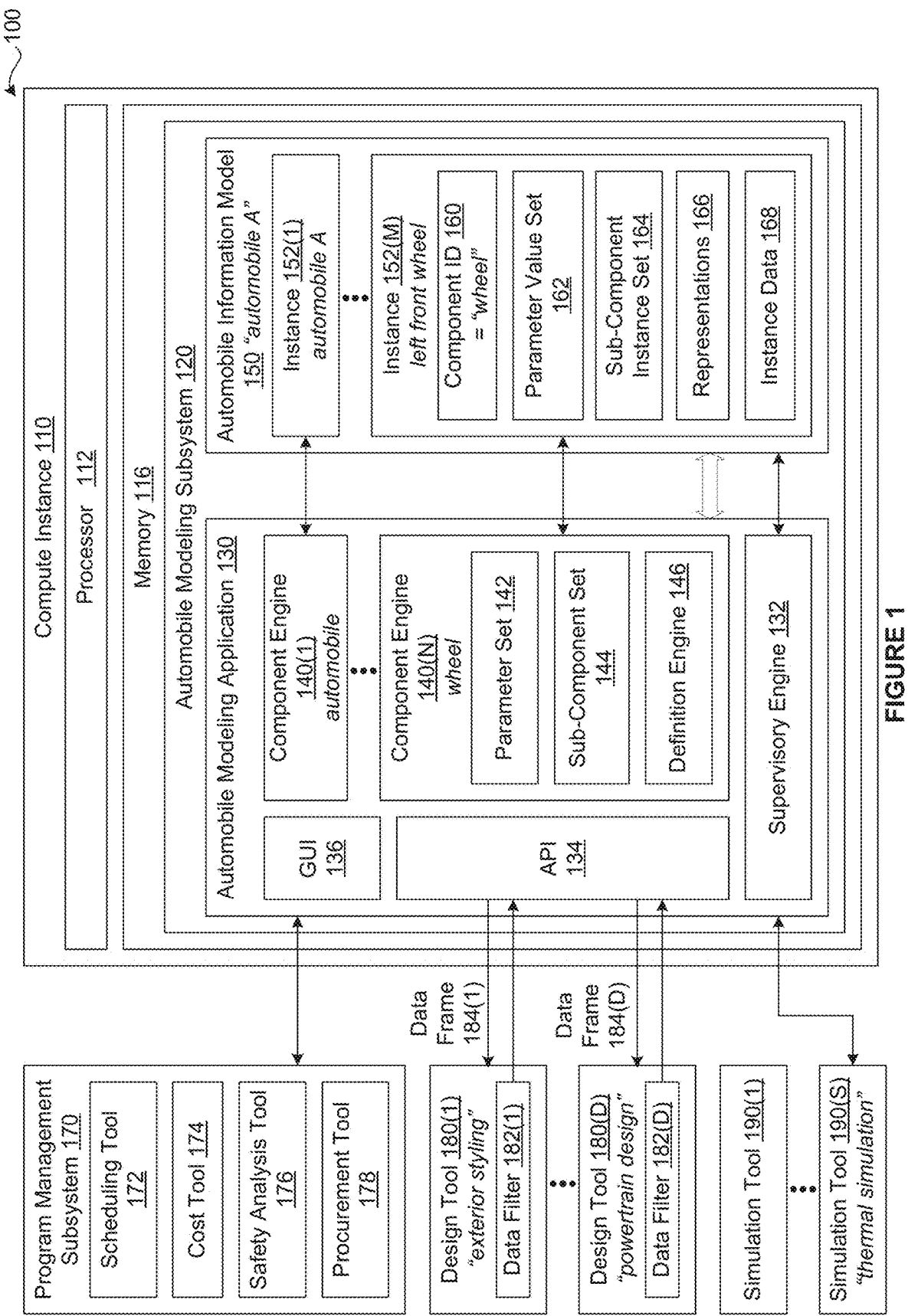
- FIG. 1 is a conceptual illustration of a computer system configured to implement one or more aspects of the present invention.

FIG. 1 is a conceptual illustration of a computer system 100 configured to implement one or more aspects of the present invention. As shown, the computer system 100 includes, without limitation, a compute instance 110, any number of design tools 180, any number of simulation tools 190, and a program management subsystem 170. In alternate embodiments, the computer system 100 may include any number of compute instances 110. For explanatory purposes, multiple instances of like objects are denoted with reference numbers identifying the object and parenthetical numbers identifying the instance where needed. In some embodiments, any number of the components of the computer system 100 may be distributed across multiple geographic locations or included in one or more cloud computing environments (i.e., encapsulated shared resources, software, data, etc.) in any combination.

As shown, the compute instance 110 includes, without limitation, a processor 112 and a memory 116. The processor 112 may be any instruction execution system, apparatus, or device capable of executing instructions. For example, the processor 112 could comprise a central processing unit ("CPU"), a graphics processing unit ("GPU"), a controller, a microcontroller, a state machine, or any combination thereof.

The memory 116 stores content, such as software applications and data, for use by the processor 112 of the compute instance 110. The memory 116 may be one or more of a readily available memory, such as random access memory ("RAM"), read only memory ("ROM"), floppy disk, hard disk, or any other form of digital storage, local or remote. In some embodiments, a storage (not shown) may supplement or replace the memory 116. The storage may include any number and type of external memories that are accessible to the processor 112. For example, and without limitation, the storage may include a Secure Digital Card, an external Flash memory, a portable compact disc read-only memory ("CD-ROM"), an optical storage device, a magnetic storage device, or any suitable combination of the foregoing.

In alternate embodiments, each of any number (including one) of the compute instances 110 may include, without limitation, any number of processors 112 and any number of memories 116 in any combination. In particular, any number of the compute instances 110 may provide a multiprocessing environment in any technically feasible fashion.

In general, the compute instance 110 is configured to implement one or more applications. Each application is described as residing in the memory 116 of a single compute instance 110 and executing on a processor 112 of the single compute instance. However, as persons skilled in the art will recognize, the functionality of each application may be distributed across any number of other applications that reside in the memories 116 of any number of compute instances 110 and execute on the processors 112 of any number of compute instances 110 in any combination. Further, the functionality of any number of applications may be consolidated into a single application or subsystem.

In particular, the compute instance 110 is configured to generate automobile designs. A typical conventional design process for an automobile may entail generating CAD geometry models for different components of the automobile using PLM software. The PLM software facilitates the process of developing complex automobile designs to the point of manufacturability by, among other things, allowing different design teams to exchange CAD geometry models of different automobile components throughout the design process.

One drawback to the above conventional design process is that PLM software and CAD geometry models typically do not include ancillary design information, such as how the different automobile components functionally interact with one another. As a result, identifying and addressing the repercussions of a significant design change can result in many design teams having to iteratively update and share their respective CAD geometry models and related information and expertise. Because the time needed to make significant design changes can oftentimes exceed the time remaining in the relevant design budgets, designers sometimes avoid such changes, thereby foregoing opportunities to optimize automobile performance, increase fuel efficiency, reduce overall size, etc. In these types of cases, the overall quality of automobile designs and the automobiles manufactured based on those designs is reduced.

Parameterized Automobile Information Model

To address the above problems, the compute instance 100 includes, without limitation, an automobile modeling subsystem 120 that includes, without limitation, an automobile modeling application 130 and an automobile information model 150. In operation, the automobile modeling application 130 implements the automobile information model 150 based on parameterized components, parameters, and relationships between instances 152 of the parameterized components. The automobile information model 150 encapsulates representations and information associated with a particular automobile design across a variety of domains and scales.

The automobile modeling subsystem 120 resides in the memory 116 and executes on the processor 112 of the compute instance 110. More precisely, the automobile modeling application 130 resides in the memory 116 and executes on the processor 112 of the compute instance 110, and the automobile information model 150 resides in the memory 116 of the compute instance 110. In alternate embodiments, the automobile information model 150 may reside in any type of memory that is accessible to the automobile modeling application 130. For instance, in some embodiments, the automobile information model 150 resides in cloud storage.

As shown, the automobile modeling application 130 includes, without limitation, any number of component engines 140, a supervisory engine 132, an application programming interface ("API") 134, and a graphical user interface ("GUI") 136. In alternate embodiments, the supervisory engine 132, the API 134 and/or the GUI 136 may be omitted from the automobile modeling application 130 and the functionality described herein may be implemented in any number of the component engines 140. The supervisory engine 132 generates and maintains the automobile information model 150 that represents a particular automobile design. In alternate embodiments, the supervisory engine 132 may generate any number of automobile information models 150, where each automobile information model 150 represents a different automobile design.

Each of the component engines 140 generates and maintains any number of instances 152 of a different component. As shown, the component engines 140 store the instances 152 in the automobile information model 150. Notably, the components represented by the component engines 140 are organized in a hierarchical design structure that implies functional relationships between components and the associated instances 152. The component engine 140(1) defines an automobile component that is the only component at the highest level of the hierarchical design structure and represents the entire automobile design. Other components are organized in the hierarchical design structure based on functionality. For instance, in some embodiments, the component engine 140(N) is associated with a wheel component that is at the lowest level of the hierarchical design structure, and another component engine 140 is associated with a powertrain component that is at an intermediate design level of the hierarchical design structure.

Each of the component engines 140(x) includes, without limitation, a parameter set 142(x), a sub-component set 144(x), and a definition engine 146(x). As described in greater detail below, the parameter set 142(x) specifies any number of parameters that enable the component engine 140(x) to generate instances 152 of the associated component. Different parameters may be associated with any aspect (e.g., functional, structural, etc.) of the associated instance 152 and at any level-of-detail in any technically feasible fashion. The parameters included in the parameter set 142(x) are also referred to herein as the parameters of the associated component and the value of a parameter is also referred to herein as the parameter value. The component engines 140 may constrain the parameter values of any number of the parameters in any technically feasible fashion. For instance, in some embodiments, relatively simple parameter value constraints are specified via the parameter set 142, while more complicated parameter value constraints are defined by the definition engine 146.

Examples of relatively simple parameter value constraints include, without limitation, lists and ranges of acceptable parameter values. For instance, in some embodiments, the sub-component set 144 associated with the component engine 140(1) "automobile" may specify that a high-level "propulsion" parameter can be one of "electric" or "combustion," and a high-level "drive type" parameter can be one of "four-wheel drive," "all-wheel drive," "rear-wheel drive," and "front wheel drive." In the same or other embodiments, the sub-component set 144 associated with the component engine 140(N) "wheel" defines a range of values for a "diameter" parameter. In the same or other embodiments, any number of sub-component sets 144 may specify a list of valid parameter values for a "material" parameter.

The sub-component set 144(x) specifies the set of components that are included in the component defined by the component engine 140(x) and are at the immediately lower level in the hierarchical design structure. The components specified in the sub-component set 144(x) are also referred to herein as "sub-components" of the component defined by the component engine 140(x). In a complementary fashion, for each of the sub-components included in the sub-component set 144(x), the instance 152(y) defined by the component engine 140(x) includes a different instance 152 of the sub-component that is referred to herein as a "sub-instance 152" of the instance 152(y).

For instance, in some embodiments, the component engine 140 "powertrain" includes the sub-component set 144 specifying that the sub-components of the powertrain are a drivetrain and an engine. Accordingly, the instance 152 of the powertrain component includes, without limitation, a sub-instance of the drivetrain and a sub-instance of the engine. At the immediately lower level of the hierarchical design structure, the component engine 140 "drivetrain" includes the sub-component set 144 specifying multiple sub-components of the drivetrain component. At the lowest level of the hierarchical design structure, the component engine 140(N) "wheel" includes an empty ("NULL") sub-component set 144 specifying that the wheel component has no sub-components.

Notably, the sub-component set 144(x) may specify the component engine 140(y) multiple times to indicate that each the instances 152 generated by the component engine 140(x) includes, without limitation, multiple instances 152 of the component engine 140(y). For instance, in some embodiments, the component engine 140 "axle subsystem" includes the sub-component set 144 specifying an axle component once and a wheel component twice (i.e., a left wheel and a right wheel).

The definition engine 146 performs any number and type of operations to generate and maintain the instances 152 included in the automobile information model 150 based on any number and type of characteristics of the associated component. As part of generating and maintaining the instances 152, the definition engine 146(x) defines each of the parameters included in the parameter set 142(x) and determines the associated parameter values. The definition engine 146 may perform any number and types of operations to determine the parameter values in any technically feasible fashion. For instance, in some embodiments, the definition engine 146 may assign one parameter value based on designer input received via the GUI 136 and compute another parameter value based on any number of other parameter values associated with any number of instances 146. Further, the definition engine 146 may specify and enforce any parameter value constraints in any technically feasible fashion.

As a general matter, a parameter may be defined based on any number of other parameters in the same or different parameter sets 142 or any other item included in the automobile information model 150. As a general matter, different parameter sets 142 may specify the same parameter. Accordingly, the parameters may establish any number of relationships (e.g., dependencies, constraints, linkages, etc) between any number of the components 140 and the associated instances 152. Notably, the definition engine 146(x) may apply the definition of each parameter in multiple different ways to determine any number of parameter values for any number of the instances 152 of any number of components, based on any amount and type of data.

For instance, in some embodiments, the definition engine 146(x) for an axle subsystem component defines a "track width" parameter based on parameters associated with the sub-components of one axle and two wheels. If a parameter value for one of the sub-instances of the instance 152(*y*) of the axle subsystem changes (e.g., based on designer input), then the definition engine 146(*x*) may (re)compute a parameter value for the track width parameter for the instance 152(*y*). However, if a parameter value for the track width parameter for the instance 152(*y*) changes, then the definition engine 146(*x*) may (re)compute a parameter value for a "length" parameter for the associated sub-instance of the axle sub-component. If, at any time, one of the definition engines 146 determines that one or more parameter values are inconsistent or invalid based on the definitions of the parameters, then the definition engine 146 and/or the automobile modeling application 130 may implement an error procedure, such as issuing an error message.

Each definition engine 146 may generate any amount and type of additional items associated with the automobile information model 150 based on any number and type of characteristics of the associated component and, optionally, any number and type of parameter values. Additional items may include, without limitation, CAD geometry models, simulation meshes, simulation configuration values, performance data (e.g., simulation results), cost data, scheduling data, part availability data, etc. Notably, as part of generating and storing an additional item, the definition engine 146 may establish any number of relationships between any number of other items associated with the automobile information model 150.

Each relationship may be a functional relationship that is based on behavior, a structural relationship that is based on structure, a composite relationship that is based on both behavior and structure, or an abstract relationship that is based on neither behavior nor structure. For example, a structural relationship could define how two components touch and transfer load between each other. A functional relationship could define how one component moves with another component during a particular operation. A composite relationship could define how heat radiates from one component to other components. An abstract relationship could specify that wiring connects data transmissions from a sensor component to a computer component.

The definition engine 146 may define each relationship in any technically feasible fashion based on any amount and type of data. For example, the definition engine 146 could define a structural relationship specifying that a "wheel well" parameter is a numeric function of a "tire diameter" parameter and an "offset" parameter. In another example, the definition engine 146 could define a structural relationship that constrains the position and orientation of a wheel to the center-line of an associated axle. Advantageously, the definition engine 146 may define relationships between any items associated with the automobile information model 150 at any level of granularity.

In various embodiments, the parameter set 142, the sub-component set 144, and the definition engine 146 may be customized in any technically feasible fashion to implement any level of parameterization and any type of relationships. In particular, a relationship may be pre-defined, designer-defined, or automatically defined. Pre-defined relationships are default relationships implemented via the parameter sets 142, the sub-component sets 144, and the definition engines 146. Designer-defined relationships are explicitly defined by the designers. For example, a designer could indicate via the design tool 180(D) "powertrain design," that one of the sub-components of the powertrain component transfers heat to another sub-component of the powertrain component. In response, the definition engines 146 associated with the indicated sub-components could generate new thermal relationships between the indicated sub-components.

Automatically defined relationships are defined implicitly via the definition engines 146 in any technically feasible fashion. For instance, in some embodiments, the definition engine 146 associated with the instance 152 "A" generates automatically defined relationships between the instance 152 "A" and any number of adjacent instances 152 based on the thermal capacity of the instance 152 "A" and a heat threshold. In operation, the definition engine 146 identifies the instances 152 that are within an envelope in which radiated heat is above the heat threshold based on the parameter values. For each of the identified instances 152 that are also specified as "heat-sensitive," the definition engine 146 creates a thermal relationship between the instance 152 "A" and the identified instance 152. If the thermal capacity for the instance 152 "A" and/or the heat threshold subsequently changes, the definition engine 146 regenerates the thermal relationships.

In addition to generating the initial automobile information model 150, the supervisory engine 135 ensures that items included in the automobile information model 150 are updated as needed. More precisely, the supervisory engine 134 flags for updating any item included in the automobile information model 150 that needs to be regenerated based on changes to other items in the automobile information model 150. Before relying on (e.g., displaying, including in a computation) an item "X" that is flagged for updating, the component engines 140 re-compute the item "X" and any other items flagged for updating that the item "X" depends upon. After an item flagged for updating is re-computed, the component engines 140 and/or the supervisory engine 134 ensure that the item is no longer flagged for updating.

The supervisory engine 134 may implement any type of mechanism to flag items for updating. For instance, in some embodiments, the supervisory engine 134 may implement a list of items that are flagged for updating. In other embodiment, each item included in the automobile information model 150 is associated with a different Boolean "update flag" or "dirty flag" that indicates whether the item is flagged for updating.

The supervisory engine 134 may determine whether to flag any item for updating in any technically feasible fashion and at any granularity. For instance, in some embodiments, the supervisory engine 134 determines whether to flag an item for updating based on the predefined, designer-defined, and automatically defined relationships. When one of the component engines 140 updates an item included in the automobile information model 150, the supervisory engine 134 identifies all the other items included in the automobile information model 150 that could be impacted by the item based on the current relationships. The supervisory engine 134 then flags the identified items for updating.

For instance, if the instances 152 "left rear wheel" and "right rear wheel" share a single parameter and the parameter value for the instance 152 "left rear wheel" is updated, then the supervisory engine 134 flags the instance 152 "right rear wheel" for updating. Further, if "driving performance" simulation results stored in the instance 152 "powertrain" has a dependency on the instance 152 "left rear wheel," then the supervisory engine 134 flags the driving performance simulation results for updating. By contrast, if the instance 152 "left front wheel" is functionally independent of the instance 152 "left rear wheel" and does not share parameter values, then the supervisory engine 134 does not flag the instance 152 "left front wheel" for updating.

In alternate embodiments, the component engines 140 and/or the definition engines 146 may flag items for updating instead of in conjunction with the supervisory engine 134. In some such embodiments, the supervisory engine 134 may be omitted from the automobile modeling subsystem 120. In other alternate embodiments, the supervisory engine 134 may coordinate the updates of the items that are flagged for updating via the component engines 140 in any technically feasible fashion and subsequently ensure that the updated items are no longer flagged for updating. In some alternate embodiments, as each item is updated, all the items that depend on the item are also updated and, consequently, no update flagging mechanism is implemented.

As shown, the automobile information model 150 includes, without limitation, any number of the instances 152. Each of the instances 152(x) includes, without limitation, a component identification ("ID") 160(x), a parameter value set 162(x), a sub-component instance set 164(x), representations 166(x), and instance data 168(x). The component identification 160(x) uniquely identifies the component engine 140 associated with the instance 152(x) in any technically feasible fashion.

The parameter value set 162(x) specifies a different parameter value for each parameter of the parameter set 142 included in the component engine 140 associated with the instance 152(x). Notably, each parameter value may be specified in any technically feasible fashion. For instance, a parameter value may be specified as a function of any number of other parameter values or items associated with the instance 152(x) and/or any number of other instances 152.

The sub-component instance set 164(x) specifies a different instance 152 for each of the sub-components specified in the sub-component set 144 included in the component engine 140 associated with the instance 152(x). The instances 152 included in the sub-component instance set 164 are also referred to as "sub-instances" of the instance 152(x). The sub-component instance set 164(x) may specify the different sub-instances 152 in any technically feasible fashion. For example, the sub-component instance set 164(x) could specify each of the sub-instances 152 via a link or an instance identifier.

The representations 166(x) include, without limitation, any number of items that represent at least a portion of the instance 152(x) in any technically feasible fashion. For instance, the representations 166(x) may include any number of CAD geometry models and any number of simulation meshes. The instance data 168 includes, without limitation, any number of items that represent any type of data associated with the instance 152 in any technically feasible fashion. For instance, the instance data 168 may include, without limitation, performance data, cost data, and schedule data. The representations 166 and the instance data 168 are described in greater detail in conjunction with FIG. 2.

As shown, the automobile modeling application 130 interacts with the program management subsystem 170, any number of the design tools 180, and any number of the simulations tools 190. In alternate embodiments, the computer system 100 may include any number and type of software applications, and the automobile modeling subsystem 120, the automobile modeling application 130, and/or the automobile information model 150 may interact with the software applications in any technically feasible fashion.

The program management subsystem 170 includes, without limitation, a schedule tool 172, a cost tool 174, a safety analysis tool 176, and a procurement tool 178. In operation, each of the tools included in the program management subsystem 170 may interact with the automobile modeling subsystem 120 to obtain any amount of instance data 168 associated with the automobile. For instance, the cost tool 174 could interact with the component engines 140 to obtain the cost data for any number of instances 152 of the automobile based on different parameter values for parameters specifying the material of different components.

The design tools 180 interact with the automobile information model 150 via the API 134. The API 134 enables any number of software applications to read and modify the automobile information model 150 via data frames 184. The data frame 184(x) enables access to, without limitation, a subset of the items associated with the automobile information model 150. In operation, the API 134 generates the data frame 184(x) based on a data filter 182(x) and the automobile information model 150. The data filter 182(x) may specify the requested items in any technically feasible fashion. For instance, in some embodiments, the data filter 182(x) specifies, without limitation, one or more of the instances 152 and a level-of-detail. The API 134 generates the data frame 184(x) that includes, without limitation, the subset of items associated with the specified instances 152 and any number of the hierarchical-related sub-instances 152 (e.g., sub-instances, sub-sub-instances, etc.) of the specified instances 152 that are consistent with the specified level-of-detail.

For example, the design tool 180(1) "exterior styling" includes, without limitation, the data filter 182(1). To facilitate updates to the exterior of the automobile, the data filter 182(1) could specify the instance 152 of the body at a digital mock-up level-of-detail. In response, the API 134 would generate the data frame 184(1) that includes the items associated with the instance 152 of the body and any hierarchically-related sub-instances 152 that are consistent with the digital mock-up level-of-detail. For example, the data frame 184(1) could include the parameter value set 162 associated with the instance 152 of the body and a CAD geometry model representing the geometry of the body at a digital mock-up level-of-detail.

In addition, the API 134 enables the design tools 180 to interface with any number of the component engines 140 to modify the automobile information model 150. Importantly, although the number of items directly accessible via a particular design tool 180 may be limited via the design frame 184, other items associated with the automobile information model 150 are flagged for updating and updated as-needed based on modifications to the items included in the design frame 184.

In some embodiments, any number of the design tools 180 can provide GUIs that enable designers to interact graphically with the data frames 184. In the same or other embodiments, the automobile modeling subsystem 130 includes the GUI 136. The GUI 136 enables designers and any number of the design tools 180 to interact graphically with the automobile information model 150 via any number (including zero) of the data frames 184. An example of the GUI 136 is described in greater detail in conjunction with FIG. 3.

Each of the simulation tools 190 performs a certain type of simulation and enables the definition engines 146 to generate a specific type of simulation results. For example, the simulation tool 190(S) performs thermal simulations. The definition engines 146 may interact with the simulation tools 190 in any technically feasible fashion to obtain any number and type of simulation results as-needed.

For example, the design tool 180(D) "powertrain" could include, without limitation, the data filter 182(D). The data filter 182(D) could specify the instance 152 of the powertrain component and a level-of-detail suitable for early simulation. The API 134 would generate the data frame 184(D) that includes the subset of the items associated with the instance 152 of the powertrain component and any hierarchically-related sub-instances 152 that are at a level-of-detail suitable for early simulation. Subsequently, the design tool 180(D) could request thermal simulation results for the instance 152 of the powertrain. In response, the definition engine 146 associated with the powertrain component would configure the simulation tool 190(S) "thermal simulation" to execute a thermal simulation based on a simulation mesh derived from a simplified wireframe CAD model of the instance 156 of the powertrain component. The API 134 would then regenerate the data frame 184(D). Notably, the definition engine 146 could store some of the thermal simulation results in the instance data 168 of instances 152 that are not included in the data frame 184(D).

As a general matter, the automobile modeling application 130, the component engines 140, and the supervisory engine 132 may enable designers and software applications to interface to the automobile information model 150 in any technically feasible fashion. In some embodiments, the automobile modeling application 130 enables updates to the automobile information model 150 until the automobile modeling application 130 determines that the automobile design is complete. The automobile modeling application 130 may determine whether the automobile design is complete in any technically feasible fashion. For instance, in some embodiments, the automobile modeling application 130 determines that the automobile design is complete based on designer input received via the GUI 136.

In some embodiments, after the automobile modeling application 130 determines that the design process is complete, the automobile modeling application 130 transmits any number of CAD geometry models to any number of software applications for use in manufacturing activities. Typically, at least one of the CAD geometry models included in the instance 152(0) of the automobile defines the automobile design at a level-of-detail and format suitable for manufacturing.

Advantageously, because the automobile modeling application 130 continually ensures that information accessed via the automobile information model 150 is up-to-date and consistent across all the instances 152, the amount of time required to make significant changes to the automobile design can be substantially reduced. Because the time in the relevant design budgets is typically limited, reducing the amount of time required to implement changes increases the ability of designers to explore different design options and implement complicated design changes. In these types of cases, the overall quality of automobile designs and the automobiles manufactured based on those designs is increased.

Further, the automobile information subsystem 120 can be used to generate insights which are not available in conventional approaches to designing automobiles. For example, because different types of data are included in the automobile information model 150, machine learning algorithms can identify patterns and correlations between different types of data to generate insights about potential issues and solutions based on data from previous automobile designs. Additionally, the relationships between components specified in the automobile modeling application 130 can be used to automatically generate boundary conditions and design space constraints for generative design applications.

Note that the techniques described herein are illustrative rather than restrictive, and may be altered without departing from the broader spirit and scope of the invention. Many modifications and variations will be apparent to those of ordinary skill in the art without departing from the scope and spirit of the described embodiments and techniques. In particular, the functionality of the automobile modeling subsystem 120, the component engines 140, the definition engine 134, the supervisory engine 132, the API 136, and the GUI 138 may be implemented in any number of software applications in any combination. Further, in various embodiments, any number of the techniques disclosed herein may be implemented while other techniques may be omitted in any technically feasible fashion. As a general matter, the techniques outlined herein are applicable to generating an automobile information model that includes CAD geometry model(s) and any amount of ancillary information based on parameterized components, structural relationships associated with the components, and functional relationships associated with the components.

Figure 2:
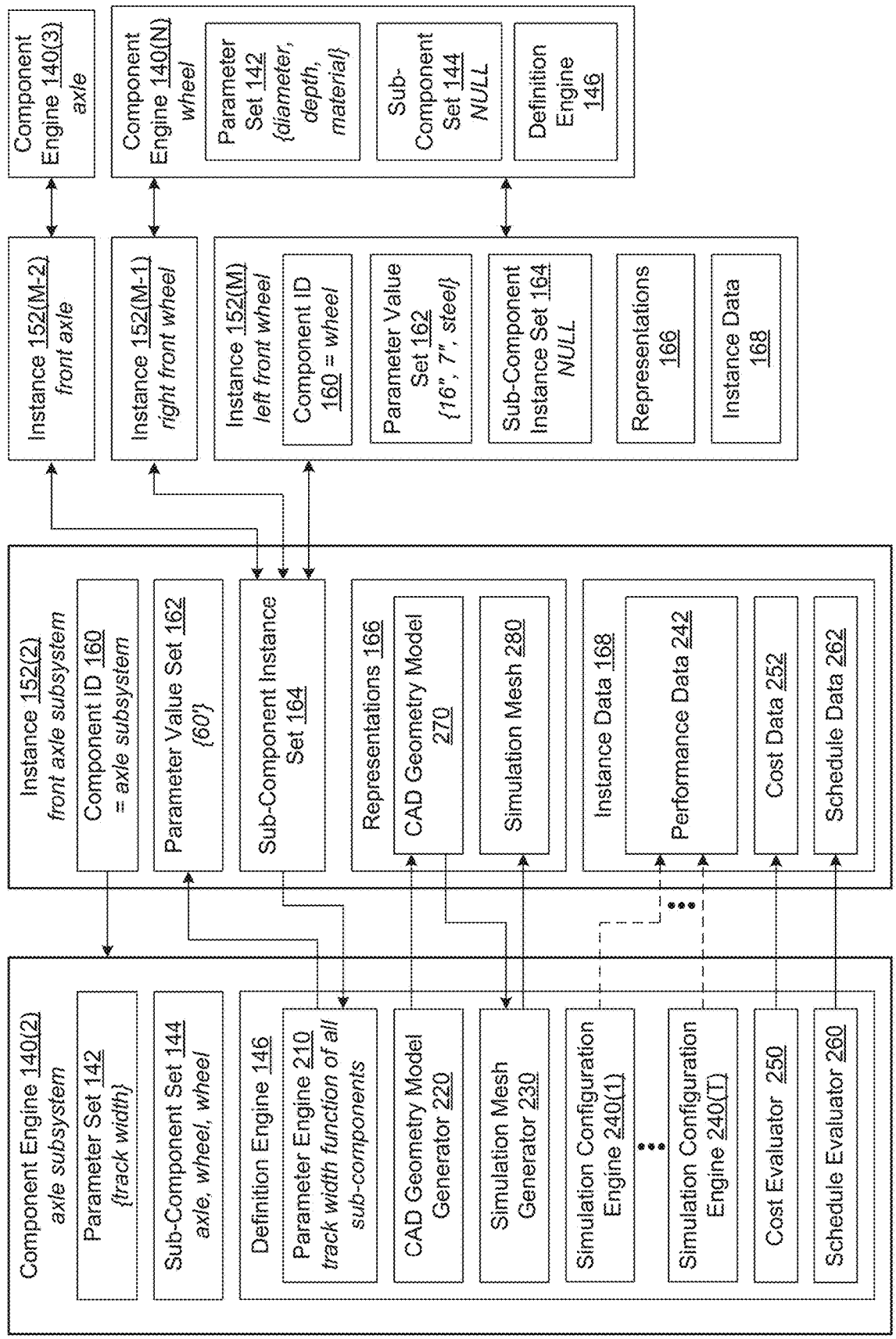
FIG. 2 illustrates a portion of an exemplary hierarchical design structure included in the automobile information model of FIG. 1, according to various embodiments of the present invention.

FIG. 2 illustrates a portion of an exemplary hierarchical design structure included in the automobile information model 150 of FIG. 1, according to various embodiments of the present invention. More specifically, FIG. 2 depicts the component engines 140(2), 143(3), and 140(N) and the instances 152(2), 152(M-2), 152(M-1), and 152(M). The component engine 140(2) represents an axle subsystem component and the instance 152(2) of the axle subsystem component represents a front axle subsystem. The component engine 140(3) represents an axle component and the instance 152(M-2) of the axle component represents a front axle. The component engine 140(N) represents a wheel component and the instances 152(M-1) and 152(M) of the wheel component represents, respectively, a right front wheel and a left front wheel.

As shown for the component engine 140(2), each of the component engines 140 includes, without limitation, the parameter set 142, the sub-component set 144, and the definition engine 146. As described previously in conjunction with FIG. 1, the parameter set 142 specifies any number and type of parameters in any technically feasible fashion. The component engine 140 may constrain the parameter values for each of the parameters in any technically feasible fashion. For instance, in some embodiments, the parameter set 142 may specify a range and/or list of acceptable parameter values for each of the parameters. In the same or other embodiments, the definition engine 146 may constrain the parameter values in any technically feasible fashion. For example, the definition engine 146 could constrain the parameter values for each parameter in an absolute fashion (e.g., range, etc.) or based on any number of relationships.

The sub-component set 144 specifies the sub-components of the component represented by the component engine 140(2) at the next lower level of the design hierarchy structure. The sub-component set 144 was described in detail in conjunction with FIG. 1. The component engine 140 may specify the sub-components in any technically feasible fashion. A sub-component may appear multiple times in the sub-component set to indicate that each instance 152 of the component includes multiple instances of the sub-component. Consequently, the number of entries included in the sub-component instance set 164 of each of the instances 152 associated with the component is equal to the number of entries included in the sub-component set 144.

The definition engine 146 performs any number and type of operations to generate and maintain the instances 152 included in the automobile information model 150 based on any number and type of characteristics of the associated component. In particular, the definition engine 146 generates the instances 152 of the associated component. Further, the definition engine 146 generates and/or updates any number and type of items associated with the automobile information model 150 based on any characteristics of the associated component.

As described previously herein in detail in conjunction with FIG. 1, as part of generating and/or updating an item associated with the automobile information model 150, the definition engine 146 may establish any number of relationships between any number of items associated with the automobile information model 150. Further, in various embodiments, the definition engine 146 may flag any number of items for updating, (re)generate any number of items, and ensure that up-to-date items stored in the automobile information model 150 by the definition engine 146 are no longer flagged for updating.

As shown, the definition engine 146 includes, without limitation, a parameter engine 210, a CAD geometry model generator 220, a simulation mesh generator 230, any number of simulation configuration engines 240(1) . . . 240(T), a cost evaluator 250, and a schedule evaluator 260. Each of the parameter engine 210, the CAD geometry model generator 220, the simulation mesh generator 230, the simulation configuration engines 240(1) . . . 240(T), the cost evaluator 250, and the schedule evaluator 260 generates any number of items and any number of relationships. In alternate embodiments, the definition engine 146 may include any number of CAD geometry model generators 220 and any number of simulation mesh generators 230. Further, the definition engine 146 may include any additional functionality (e.g., generators, engines, evaluators, etc.) that generate any additional representations 166 and/or items of the instance data 168 in any technically feasible fashion.

The parameter engine 210 defines each of the parameters included in the parameter set 142(x) and determines the associated parameter values. Further, the parameter engine 210 may specify and enforce any constraints associated with parameter values in any technically feasible fashion. The parameter engine 210 may perform any number and types of operations to determine the parameter values in any technically feasible fashion. In particular, the parameter engine 210 may access any number of items (e.g., parameter values, etc.) included in the automobile information model 150 to compute a parameter value. As part of defining the parameters, determining the associated parameter values, and specifying and enforcing constraints, the parameter engine 210 may generate any number of relationships. Relationships are described in detail previously in conjunction with FIG. 1.

Each CAD geometry model generator 220 generates a different CAD geometry model 270. Accordingly, each of the CAD geometry models 270 may be associated with a different combination of format, portion of the automobile design, and level-of-detail. For example, the CAD geometry model generator 220(1) could generate a wireframe model, the CAD geometry model generator 220(2) could generate a surface model, and the CAD geometry model generator 220(3) could generate a solid model. One or more of the CAD geometry model generators 220 generates the CAD geometry model 270 that specifies geometries at a level-of-detail and in a format that is suitable for manufacturing. As part of generating the CAD geometry models 270, each of the CAD geometry model generators 220 may generate any number of relationships.

Each simulation mesh generator 230 generates a simulation mesh 280 for a different type of simulation based on one of the CAD geometry models 270. Accordingly, each simulation mesh 280 may be associated with a different level-of-detail. Each of the simulation configuration engines 240(1) . . . 240(T) configures one of the simulation tools 190 to perform a simulation based on one of the simulation meshes 280 and subsequently stores any portion of the simulation results as performance data 242 in the automobile information model 150. Notably, the simulation configuration engine 240(1) . . . 240(T) may store different portions of the simulation results as different items in the performance data 242 associated with different instances 152 of different components. As part of performing the simulation and storing the simulation results, each of the simulation configuration engines 240(1) . . . 240(T) may generate any number of relationships. Some examples of simulations include, without limitation, a computational fluid dynamics ("CFD") simulation, a dynamic simulation, a static simulation, a thermal simulation, a stress analysis simulation, a vibration simulation, etc.

The cost evaluator 250 performs any number and type of operations to compute any number and type of cost-related items and then stores the cost-related items as cost data 252 in the automobile information model 150. Similarly, the schedule evaluator 260 performs any number and type of operations to compute any number and type of schedule-related items and then stores the schedule-related items as schedule data 262 in the automobile information model 150. Examples of schedule-related items include dates associated with procuring parts for the associated instance 152, the amount of time required to manufacture the associated instance 152, etc. The cost evaluator 250 and the schedule evaluator 260 may store, respectively, different cost-related items and different schedule-related items in the instance data 168 associated with different instances 152 of different components. During operation, the cost evaluator 250 and the schedule evaluator 260 may generate any number of relationships.

As shown in detail for the instance 152(2), each of the instances 152 includes, without limitation, the component identifier (ID) 160, the parameter value set 162, the sub-component instance set 164, the representations 166, and the instance data 168. As described in detail in previously herein in conjunction with FIG. 1, the component identification 160(x) uniquely identifies the component engine 140 associated with the instance 152(x) in any technically feasibly fashion. The parameter value set 162(x) specifies a different parameter value for each parameter of the parameter set 142 included in the component engine 140 associated with the instance 152(x). At any given time, any number of the parameter values may be flagged for updating. The sub-component instance set 164(x) specifies a different instance 152 for each of the sub-components specified in the sub-component set 144 included in the component engine 140 associated with the instance 152(x).

The representations 166 include, without limitation, the CAD geometry model 270 and the simulation mesh 280. In alternate embodiments, the representations 166 may include any number of the CAD geometry models 270 and any number of the simulation meshes 280. Because the component engine 140 generates the CAD geometry model 270 and the simulation meshes 280 on an as-needed basis, the number of the CAD geometry models 270 and the number of the simulations meshes 280 included in the representations 166 typically varies during the design process. Further, at any given time, any number of the CAD geometry models 270 and any number of the simulations meshes 280 may be flagged for updating. In alternate embodiments, the representations 166 may include, without limitation, any number and type of representations of the instance 152.

The instance data 168 includes, without limitation, the performance data 242, the cost data 252, and the schedule data 262. Typically, the majority of items included in performance data 242, the cost data 252, and the schedule data 262 are generated by the associated component engine 140. However, any item included in the performance data 242, the cost data 252, and the schedule data 262 can be generated by any of the component engines 140 based on any number and type of relationships. Because the component engine 140 generates the instance data 168 on an as-needed basis, the number of items included in each of the performance data 242, the cost data 252, and the schedule data 262 typically varies during the design process. Further, at any given time, any number of the items included in each of the performance data 242, the cost data 252, and the schedule data 262 may be flagged for updating. In alternate embodiments, the instance data 169 may include any amount and type of additional items that are organized and generated in any technically feasible fashion.

For explanatory purposes only, FIG. 2 depicts exemplary values for some items in italics and depicts the sub-instances of the instance 152(2) and the associated component engines 140. As shown, the component engine 140(2) represents an axle subsystem component. As part of generating the instance 152(2) that represents a front axle subsystem, the component engine 140(2) computes the parameter value 60' for the "track width" parameter based on the sub-components of the instance 152(2). The sub-instances of the instance 152(2) are the instances 152(M-2), 152(M-1), and 152(M). The instance 152(M-2) represents the front axle and is generated by the component engine 140(3) that represents an axle component. The instance 152(M-1) represents the right front wheel and is generated by the component engine 140(N) that represents a wheel component. The instance 152(M) is also generated by the component engine 140(N) and represents the left front wheel. More precisely, the component engine 140(N) generates the instance 152(M) based on the parameter values of 16", 7", and "steel" for, respectively the "diameter," "depth," and "material" parameters. The wheel component has no sub-components and, consequently, the left front wheel and the right front wheel have no sub-instances.

Viewing Portions of an Automobile Design via Data Frames

Figure 3:
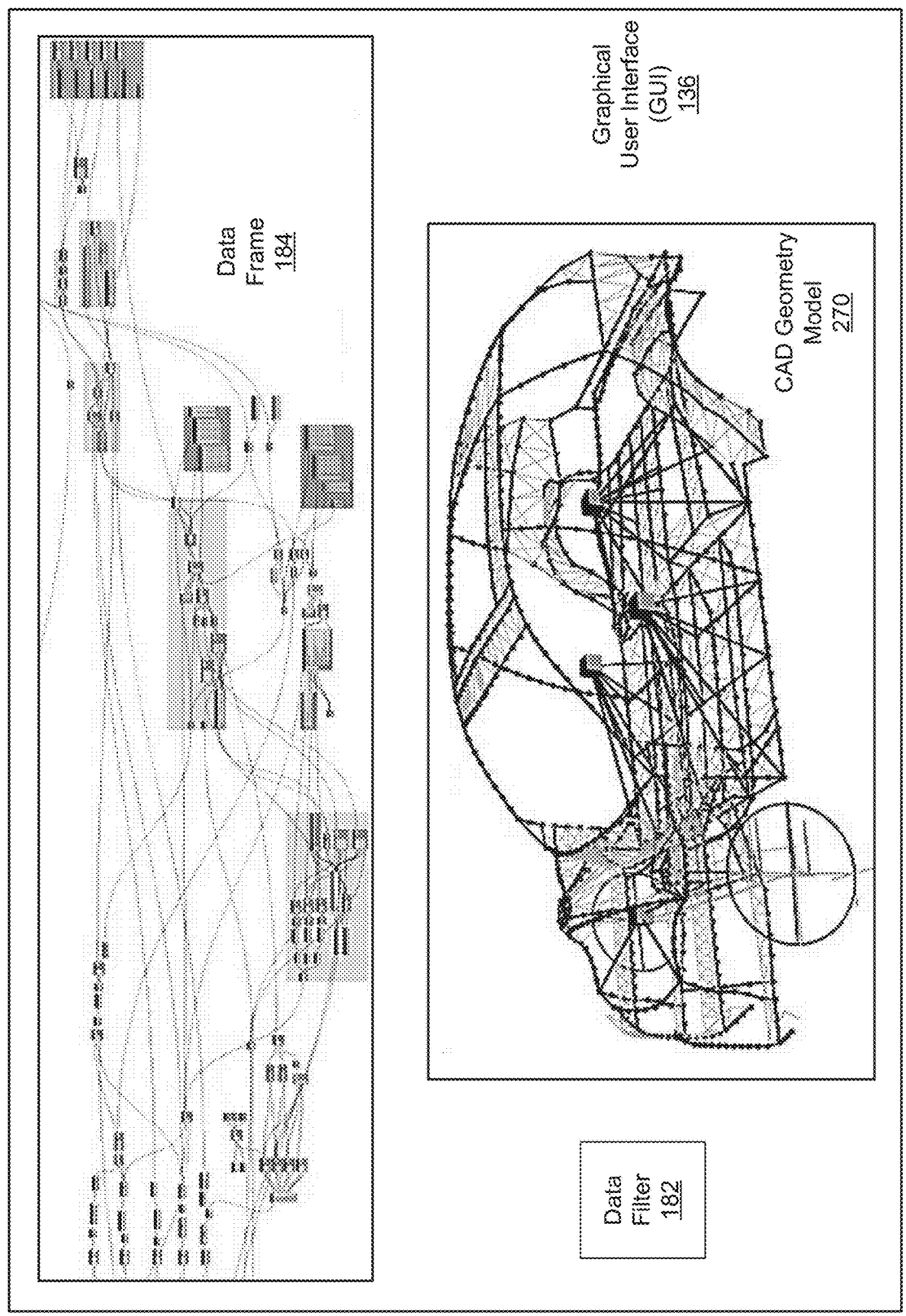
FIG. 3 illustrates an example of the graphical user interface (GUI) of FIG. 1, according to various embodiments of the present invention.

FIG. 3 illustrates an example of the GUI 136 of FIG. 1, according to various embodiments of the present invention. As shown, the GUI 136 includes, without limitation, the data filter 182, a visible portion of the data frame 184, and the CAD geometry model 270. The data filter 182 specifies, without limitation, the instances 152 and the level-of-detail that are associated with the data frame 184 and the CAD geometry model 270.

For explanatory purposes only, the data filter 182 specifies the instance 152(x) representing the chassis and the instance 152(2) representing the front axle subsystem. In addition, the data filter 182 specifies a simplified beam and shell level-of-detail. Although not shown, the GUI 136 may implement any number of filtering widgets, selection widgets, sorting widgets, etc. in any technically feasible fashion to facilitate the specification of the data filter 182. Further, the GUI 136 may facilitate interactions with any number of the design tools 180, each of which may implement a different data filter 182.

The data frame 184 includes, without limitation, the selected instances 152, the hierarchical sub-instances associated with the selected instances 152, and the associated relationships at the selected level-of-detail. The GUI 136 depicts a visible portion of the data frame 184 based on any number and type of display widgets. The visible portion of the data frame 184 includes, without limitation, parameter values for multiple instances 152 and performance data 242 associated with the selected simplified beam and shell level-of-detail.

The CAD geometry model 270 is a composite model that subsumes different CAD geometry models 270 associated with both the selected instances 152 and the selected level-of-detail, thereby geometrically representing the data frame 184. Accordingly, the CAD geometry model 270 geometrically depicts the chassis and the front axle sub-assembly at the simplified beam and shell level-of-detail. In general, the GUI 136 may annotate the CAD geometry model 270 in any technically feasible fashion based on any amount and type of items included in the automobile information model 150. As shown, the GUI 136 depicts key loads that are stored in the performance data 242 of the instance 152(1) of the automobile as shaded cubes within the CAD geometry model 270.

In some embodiments, the GUI 136 facilitates direct updates to parameter values associated with the selected instances 152 via both the displayed data frame 284 and the CAD geometry model 270. Although not shown, the GUI 136 provides sliders that enable updates to parameter values displayed via the visible portion of the data frame 184. The GUI 136 also provides re-sizing tools that enable updates to parameter values via manipulation of the CAD geometry model 270. Importantly, as parameter values are updated, the supervisory engine 132 identifies any items included in the automobile information model 150 that are dependent on the updated parameter values. The supervisory engine 132 then flags the identified items for updating irrespective of whether the identified items are included in the data frame 184.

For example, if a parameter value of the chassis that specifies the size of the rear wheel wells is updated, then the automobile information model 150 flags the instances 152 representing the rear axle subsystem, the rear wheels and the rear axle for updating. As shown, the data frame 184 includes none of the instances 152 representing the rear axle subsystem, the rear wheels, and the rear axle.

In general, the supervisory engine 132 may flag any number and type of items for updating in any technically feasible fashion and at any level of granularity. For instance, if a parameter value of the instance 152(2) is updated, then the supervisory engine 132 may set a value for a Boolean update flag to true for each of the instances 152, parameter values, the representations 166, and items of instance data 168 that is dependent on the parameter value.

The supervisory engine 132 updates items that are flagged for updating on an as-needed basis. For example, if an item that is flagged for updating is included in the visible portion of the data frame 184 or a visible portion of the data frame 184 is dependent on the item, then the supervisory engine 132 updates the item. By contrast, if an item that is flagged for updating does not impact any current accessed item, then the supervisory engine 132 does not update the item until the item or a dependent item is accessed. In this manner, the supervisory engine 132 reduces re-computations while ensuring that any items included in the automobile information model 150 are up-to-date when accessed.

Figure 4:
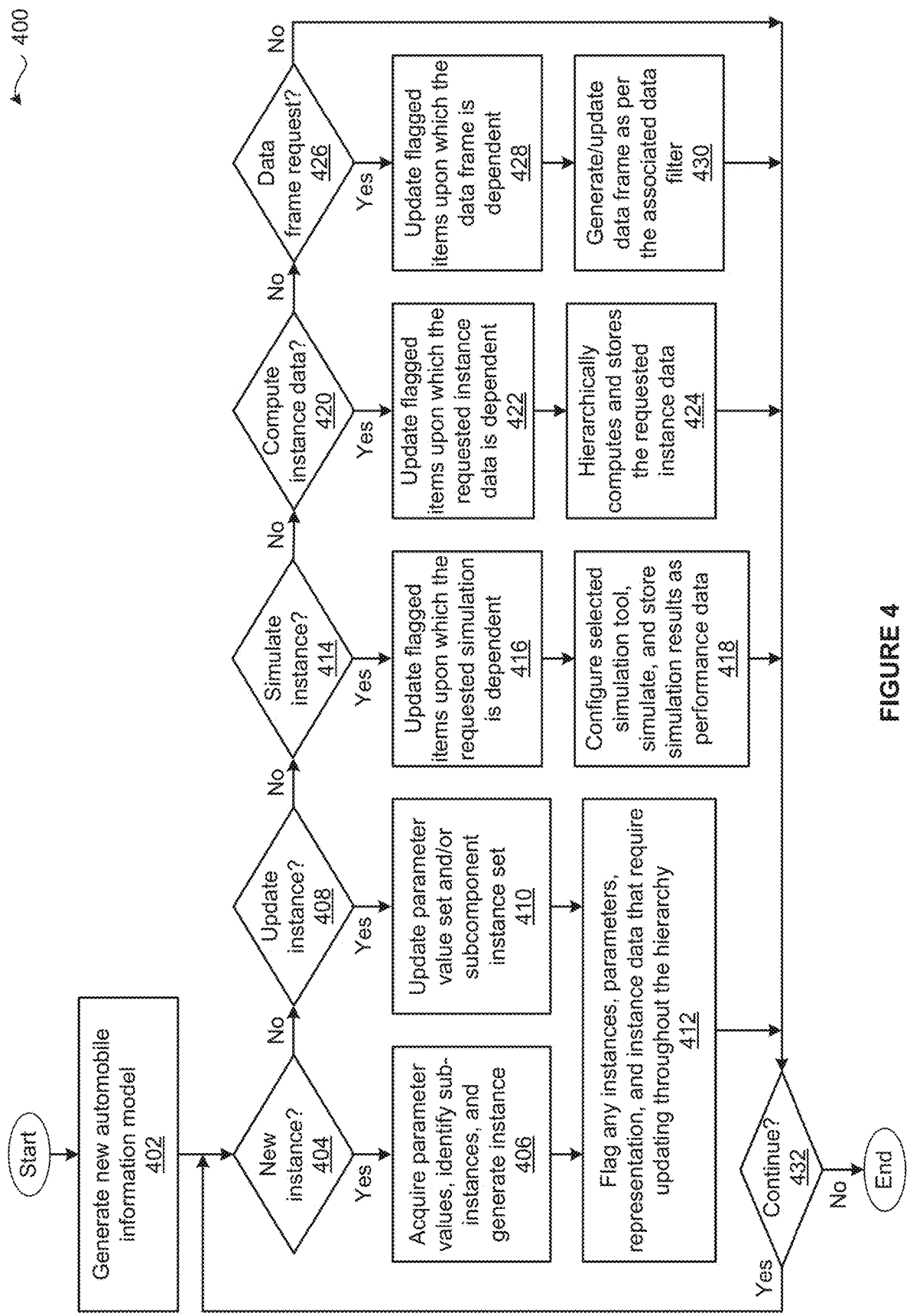
FIG. 4 is a flow diagram of method steps for designing an automobile using parameterized components, according to various embodiments of the present invention.

FIG. 4 is a flow diagram of method steps for designing an automobile using parameterized components, according to various embodiments of the present invention. Although the method steps are described with reference to the systems of FIGS. 1-3, persons skilled in the art will understand that any system configured to implement the method steps, in any order, falls within the scope of the present invention.

As shown, a method 400 begins at step 402, where the supervisory engine 132 generates a new automobile information model 150. At step 404, the automobile modeling application 130 determines whether the automobile modeling application 130 has received a request to generate a new instance 152 of a selected component. If, at step 404, the automobile modeling application 130 determines that the automobile modeling application 130 has received a request to generate a new instance 152 of a selected component, then the method 400 proceeds to step 406.

At step 406, the component engine 140 associated with the selected component acquires a parameter value for each of the parameters specified in the parameter set 142 and identifies the sub-instance 152 associated with each of the components specified in the sub-component set 144. The component engine 140 generates a new instance 152 based on the parameter values and the sub-instances 152 and then stores the instance 152 in the automobile information model 150. The method 400 then proceeds directly to step 412.

If, however, at step 404, the automobile modeling application 130 determines that the automobile modeling application 130 has not received a request to generate a new instance 152 of a selected component, then the method 400 proceeds directly to step 408. At step 408, the automobile modeling application 130 determines whether the automobile modeling application 130 has received a request to update a selected instance 152. If, at step 408, the automobile modeling application 130 determines that the automobile modeling application 130 has received a request to update a selected instance 152, then the method 400 proceeds to step 410. At step 410, the component engine 140 associated with the selected instance 152 updates the parameter value set 162 and/or the sub-component instance set 164. The method 400 then proceeds to step 412.

At step 412, the supervisory engine 132 flags for updating any items included in the automobile information model 150 that are impacted by the addition of the new instance 152 or updates to the selected instance 152. The supervisory engine 132 may flag for updating any number and type of items in any technically feasible fashion. For instance, if a particular parameter value of the selected instance 152 is updated, then the supervisory engine 132 may activate a Boolean update flag for each of the instances 152, parameter values, the representations 166, and the instance data 168 that is dependent on the parameter value. The method 400 then proceeds directly to step 432.

Returning now to step 408, if the automobile modeling application 130 determines that the automobile modeling application 130 has not received a request to update a selected instance 152, then the method 400 proceeds directly to step 414. At step 414, the automobile modeling application 130 determines whether the automobile modeling application 130 has received a request to simulate a selected instance 152. If, at step 414, the automobile modeling application 130 determines that the automobile modeling application 130 has received a request to simulate a selected instance 152, then the method 400 proceeds to step 416.

At step 416, the component engines 140 update any items flagged for updating upon which the requested simulation is dependent. Notably, as part of step 416, for each of any number of instances 152, any number of the CAD model generators 220 and any number of the simulation mesh generators 230 may (re)generate any number of the CAD geometry models 270 and any number of the simulation meshes 280. At step 418, the component engine 140 associated with the selected instance 152 causes the appropriate simulation configuration engine 240(1) 240(T) to execute the requested simulation based on the associated simulation mesh 280. Subsequently, the simulation configuration engine 240(1) . . . 240(T) updates the performance data 242 associated with any number of the instances 152 based on the simulation results. The method 400 then proceeds directly to step 432.

If, however, at step 414, the automobile modeling application 130 determines the automobile modeling application 130 has not received a request to simulate the selected instance 152, then the method 400 proceeds directly to step 420. At step 420, the automobile modeling application 130 determines whether the automobile modeling application 130 has received a request to compute a selected item of the instance data 168. If, at step 420, the automobile modeling application 130 determines that the automobile modeling application 130 has received a request to compute a selected item of the instance data 168, then the method 400 proceeds to step 422.

At step 422, the automobile modeling application 130 causes any number of the component engines 140 to update items that are flagged for updating upon which the selected item is dependent. At step 424, the component engine 140 associated with the selected item hierarchically computes the selected item and then stores the selected item in the instance data 168. The component engine 140 may compute and store the selected item in any technically feasible fashion. For instance, in some embodiments, if the requested item is associated with cost, then the cost evaluator 250 computes the selected item and then stores the selected item in the cost data 252 of the instance 152 associated with the selected item. By contrast, if the selected item is associated with scheduling, then the schedule evaluator 260 computes the selected item and then stores the selected item in the schedule data 262 of the instance 152 associated with the selected item. The method 400 then proceeds directly to step 432.

If, however, at step 420, the automobile modeling application 130 determines that the automobile modeling application 130 has not received a request to compute a selected item of the instance data 168, then the method 400 proceeds directly to step 426. At step 426, the automobile modeling application 130 determines whether the automobile modeling application 130 has received a request to generate or update the data frame 184. If, at step 426, the automobile modeling application 130 determines that the automobile modeling application 130 has received a request to generate or update the data frame 184, then the method 400 proceeds to step 428.

At step 428, the automobile modeling application 130 causes any number of the component engines 140 to update any items flagged for updating upon which the requested data frame 184 is dependent. In particular, as part of step 428, for each of any number of the instances 152, any number of the CAD model generators 220 may (re)generate any number of the CAD geometry models 270. At step 430, the component engine(s) 140 associated with the requested data frame 184 generate or update the data frame 184 based on the instances 152 and the level-of-detail specified via the data filter 182 associated with the data frame 184. The method 400 then proceeds directly to step 432.

If, however, at step 426, the automobile modeling application 130 determines that the automobile modeling application 130 has not received a request to generate or update the data frame 184, then the method 400 proceeds directly to step 432.

At step 432, the automobile modeling application 130 determines whether the automobile design is complete. The automobile modeling application 130 may determine whether the automobile design is complete in any technically feasible fashion. For instance, in some embodiments, the automobile modeling application 130 determines that the automobile design is complete based on designer input received via the GUI 136. If, at step 432, the automobile modeling application 130 determines that the automobile design is not complete, then the method 400 returns to step 404, where the automobile modeling application 130 continues to update the automobile information model 150.

If, however, at step 432, the automobile modeling application 130 determines that the automobile design is complete, then the method 400 terminates. At the end of the design process, at least one of the CAD geometry models 270 included in the instance 152(0) of the automobile included in the automobile information model 150 defines the automobile design at a level-of-detail and format suitable for manufacturing. In some embodiments, the automobile modeling application 130 transmits any number of the CAD geometry models 270 to any number of software applications for use in manufacturing activities.

In sum, the disclosed techniques may be used to efficiently design automobiles. In one embodiment, an automobile modeling application includes, without limitation, any number of component engines, a supervisory engine, an API and a GUI. Together, the component engines provide a hierarchical structure for the design of automobiles based on parameters, structural relationships, and functional relationships. In operation, the supervisory engine creates and maintains an automobile information model that defines an automobile design and each of the component engines creates and maintains any number of instances included in the automobile information model. Each of the component engines includes, without limitation, a different parameter set, a sub-component set, and a definition engine that defines the structure and functionality of the instances of an associated component.

The parameter set includes any number of parameters and enables customization of each instance of the associated component via a corresponding, instance-specific parameter value set. The sub-component set defines any number (including zero) of other components that are included in the associated component and enables customization of each instance of the associated component via a corresponding, instance-specific sub-component instance set. The definition engine generates and maintains dependencies and constraints, representations (i.e., CAD geometry models and simulation meshes) and any number and amount and type of instance data (e.g., simulation results, cost, part availability, etc.) that are associated with the instances of the associated component. Notably, each of the definition engines can read from and write to any item included in the automobile information model 150.

As items (e.g., parameter values, instances, representations, instance data, etc.) included in the automobile information model are updated, the supervisory engine flags for updating other items that are directly or indirectly dependent on the updated items. When an attempt is made to access an item that is flagged for updating, the appropriate component engine automatically updates the item and ensures that the item is no longer flagged for updating. In this fashion, the supervisory engine continually and automatically provides access to up-to-date information that is consistent with the current parameter values, structural relationships, and functional relationships defined by the component engines.

[moo] At least one technical advantage of the disclosed techniques relative to the prior art is that the automobile modeling application automatically and efficiently generates and updates the automobile information model based on parameter values, functional relationships, and structural relationships associated with different parameterized components. Because the automobile modeling application continually ensures that information accessed via the automobile information model is up-to-date and consistent across all instances of all components, the amount of time required to make significant changes to the automobile design can be substantially reduced. As a result, designers are more likely to make significant changes to the designs of automobile components during the design process, which increases the overall quality of the automobile design. In addition, because different types of data are included in the automobile information model, the automobile information subsystem can be used to generate insights about potential issues and solutions. These technical advantages represent one or more technological advancements over the prior art approaches.

Clause 1. In some embodiments, a computer-implemented method for designing automobiles comprises determining a first parameter value associated with a first instance of a first parameterized automobile component; computing a second parameter value associated with a second instance of a second parameterized automobile component based on a structural relationship between the first instance and the second instance; and generating a computer-aided design (CAD) geometry model for an automobile based on the first parameter value, the second parameter value, and one or more functional relationships defined between two or more instances included in a plurality of parameterized automobile component instances.

Clause 2. The computer-implemented method of clause 1, wherein the first parameter value specifies a functional characteristic or a structural characteristic of the first instance.

Clause 3. The computer-implemented method of clauses 1 or 2, wherein determining the first parameter value comprises computing the first parameter value based on a composite relationship between the first instance and a third instance of a third parameterized automobile component.

Clause 4. The computer-implemented method of any of clauses 1-3, wherein computing the second parameter value comprises generating a simulation mesh for the first instance based on the first parameter value; performing a simulation based on the simulation mesh to determine a simulation result; and determining the second parameter value based on the simulation result.

Clause 5. The computer-implemented method of any of clauses 1-4, wherein the CAD geometry model comprises a wireframe model, a surface model, or a solid model.

Clause 6. The computer-implemented method of any of clauses 1-5 wherein the plurality of parameterized automobile component instances comprises an automobile information model, and wherein the CAD geometry model is stored in the automobile information model.

Clause 7. The computer-implemented method of any of clauses 1-6, further comprising generating a simulation mesh based on the CAD geometry model, wherein the simulation mesh is stored in an automobile information model comprising the plurality of parameterized automobile component instances.

Clause 8. The computer-implemented method of any of clauses 1-7, further comprising generating a data frame based on the plurality of parameterized automobile component instances and a data filter that specifies a level-of-detail and one or more instances included in the plurality of automobile component instances; and transmitting the data frame to a design application or a manufacturing application.

Clause 9. The computer-implemented method of any of clauses 1-8, further comprising generating a graphical user interface that displays the first parameter value, the second parameter value, and the CAD geometry model.

Clause 10. The computer-implemented method of any of clauses 1-9, wherein the second instance comprises a sub-instance of the first instance.

Clause 11. In some embodiments, one or more non-transitory computer readable media include instructions that, when executed by one or more processors, cause the one or more processors to design automobiles by performing the steps of determining a first parameter value associated with a first instance of a first parameterized automobile component; computing a second parameter value associated with a second instance of a second parameterized automobile component based on a structural relationship between the first instance and the second instance; and generating a computer-aided design (CAD) geometry model for an automobile based on the first parameter value, the second parameter value, and one or more functional relationships defined between two or more instances included in a plurality of parameterized automobile component instances.

Clause 12. The one or more non-transitory computer readable media of clause 11, wherein the first parameter value specifies a functional characteristic or a structural characteristic of the first instance.

Clause 13. The one or more non-transitory computer readable media of clauses 11 or 12, wherein determining the first parameter value comprises automatically generating a relationship based on a third parameter value associated with a third instance of a third parameterized automobile component, and computing the first parameter value based on the third relationship.

Clause 14. The one or more non-transitory computer readable media of any of clauses 11-13, wherein computing the second parameter value comprises generating a simulation mesh for the first instance based on the first parameter value; performing a simulation based on the simulation mesh to determine a simulation result; and determining the second parameter value based on the simulation result.

Clause 15. The one or more non-transitory computer readable media of any of clauses 11-14, wherein the CAD geometry model comprises a wireframe model, a surface model, or a solid model.

Clause 16. The one or more non-transitory computer readable media of any of clauses 11-15, wherein the plurality of parameterized automobile component instances comprises an automobile information model, and wherein the CAD geometry model is stored in the automobile information model.

Clause 17. The one or more non-transitory computer readable media of any of clauses 11-16, further comprising computing a data item associated with at least one of cost, scheduling, and procurement based on the automobile information model, wherein the data item is stored in an automobile information model comprising the plurality of parameterized automobile component instances.

Clause 18. The one or more non-transitory computer readable media of any of clauses 11-17, further comprising generating a data frame based on the plurality of parameterized automobile component instances and a data filter that specifies a level-of-detail and one or more instances included in the plurality of automobile component instances; and transmitting the data frame to a design application or a manufacturing application.

Clause 19. The one or more non-transitory computer readable media of any of clauses 11-18, wherein determining the first parameter value comprises generating a graphical user interface (GUI) that displays the first instance of the first parameterized automobile component, and receiving input specifying the first parameter value via the GUI.

Clause 20. In some embodiments, a system comprises one or more memories storing instructions; and one or more processors that are coupled to the one or more memories and, when executing the instructions, are configured to determine a first parameter value associated with a first instance of a first parameterized automobile component; compute a second parameter value associated with a second instance of a second parameterized automobile component based on a structural relationship between the first instance and the second instance; and generate a computer-aided design (CAD) geometry model for an automobile based on the first parameter value, the second parameter value, and one or more functional relationships defined between two or more instances included in a plurality of parameterized automobile component instances.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for designing automobiles, the method comprising:
    determining a first parameter value associated with a first parameter of a first instance of a first parameterized automobile component;
    computing a second parameter value associated with a second parameter of a second instance of a second parameterized automobile component based on a structural relationship between the first parameter of the first instance and the second parameter of the second instance;
    generating a computer-aided design (CAD) geometry model for an automobile based on the first parameter value, the second parameter value, and an automobile information model organizing the first parameterized automobile component and the second parameterized automobile component in a hierarchical design structure based on the structural relationship and one or more functional relationships between behaviors of the first instance and behaviors of the second instance;
    modifying an item included in the automobile information model;
    automatically propagating the modification throughout the CAD geometry model to generate a modified CAD geometry model; and
    in response to generating the modified CAD geometry model, executing a functional simulation on a first simulation mesh in order to regenerate the one or more functional relationships between the behaviors of the first instance and the behaviors of the second instance.

2. The computer-implemented method of claim 1, wherein the first parameter specifies a functional characteristic or a structural characteristic of the first instance of the first parameterized automobile component.

3. The computer-implemented method of claim 1, wherein determining the first parameter value comprises computing the first parameter value based on a composite relationship between the first parameter of the first instance and a third parameter of a third instance of a third parameterized automobile component.

4. The computer-implemented method of claim 1, wherein computing the second parameter value comprises:
    generating a second simulation mesh for the first instance based on the first parameter value;
    performing a simulation based on the second simulation mesh to determine a simulation result; and
    determining the second parameter value based on the simulation result and the structural relationship between the first parameter of the first instance and the second parameter of the second instance.

5. The computer-implemented method of claim 1, wherein the CAD geometry model comprises a wireframe model, a surface model, or a solid model.

6. The computer-implemented method of claim 1, wherein a plurality of parameterized automobile component instances comprises the automobile information model, and wherein the CAD geometry model is stored in the automobile information model.

7. The computer-implemented method of claim 1, further comprising generating a second simulation mesh based on the CAD geometry model, wherein the second simulation mesh is stored in the automobile information model, and wherein the automobile information model comprises a plurality of parameterized automobile component instances.

8. The computer-implemented method of claim 1, further comprising:
    generating a data frame based on a plurality of parameterized automobile component instances and a data filter that specifies a level-of-detail and one or more instances included in the plurality of parameterized automobile component instances; and
    transmitting the data frame to a design application or a manufacturing application.

9. The computer-implemented method of claim 1, further comprising generating a graphical user interface that displays the first parameter value, the second parameter value, and the CAD geometry model.

10. The computer-implemented method of claim 1, wherein the second instance comprises a sub-instance of the first instance.

11. One or more non-transitory computer readable media including instructions that, when executed by one or more processors, cause the one or more processors to design automobiles by performing the steps of:

determining a first parameter value associated with a first parameter of a first instance of a first parameterized automobile component;

computing a second parameter value associated with a second parameter of a second instance of a second parameterized automobile component based on a structural relationship between the first parameter of the first instance and the second parameter of the second instance;

generating a computer-aided design (CAD) geometry model for an automobile based on the first parameter value, the second parameter value, and an automobile information model organizing the first parameterized automobile component and the second parameterized automobile component in a hierarchical design structure based on the structural relationship and one or more functional relationships between behaviors of the first instance and behaviors of the second instance;

modifying an item included in the automobile information model;

automatically propagating the modification throughout the CAD geometry model to generate a modified CAD geometry model; and in response to generating the modified CAD geometry model, executing a functional simulation on a first simulation mesh in order to regenerate the one or more functional relationships between the behaviors of the first instance and the behaviors of the second instance.

12. The one or more non-transitory computer readable media of claim 11, wherein the first parameter specifies a functional characteristic or a structural characteristic of the first instance of the first parameterized automobile component.

13. The one or more non-transitory computer readable media of claim 11, wherein determining the first parameter value comprises automatically generating a third relationship between the first parameter of the first instance and a third parameter of a third instance of a third parameterized automobile component, and computing the first parameter value based on the third relationship.

14. The one or more non-transitory computer readable media of claim 11, wherein computing the second parameter value comprises:

generating a second simulation mesh for the first instance based on the first parameter value;

performing a simulation based on the second simulation mesh to determine a simulation result; and determining the second parameter value based on the simulation result and the structural relationship between the first parameter of the first instance and the second parameter of the second instance.

15. The one or more non-transitory computer readable media of claim 11, wherein the CAD geometry model comprises a wireframe model, a surface model, or a solid model.

16. The one or more non-transitory computer readable media of claim 11, wherein a plurality of parameterized automobile component instances comprises the automobile information model, and wherein the CAD geometry model is stored in the automobile information model.

17. The one or more non-transitory computer readable media of claim 11, further comprising computing a data item associated with at least one of cost, scheduling, and procurement based on the automobile information model, wherein the data item is stored in the automobile information model, and wherein the automobile information model comprises a plurality of parameterized automobile component instances.

18. The one or more non-transitory computer readable media of claim 11, further comprising:

generating a data frame based on a plurality of parameterized automobile component instances and a data filter that specifies a level-of-detail and one or more instances included in the plurality of parameterized automobile component instances; and transmitting the data frame to a design application or a manufacturing application.

19. The one or more non-transitory computer readable media of claim 11, wherein determining the first parameter value comprises generating a graphical user interface (GUI) that displays the first parameter of the first instance of the first parameterized automobile component, and receiving input specifying the first parameter value via the GUI.

20. A system, comprising:

one or more memories storing instructions; and one or more processors that are coupled to the one or more memories and, when executing the instructions, are configured to:

determine a first parameter value associated with a first parameter of a first instance of a first parameterized automobile component;

compute a second parameter value associated with a second parameter of a second instance of a second parameterized automobile component based on a structural relationship between the first parameter of the first instance and the second parameter of the second instance;

generate a computer-aided design (CAD) geometry model for an automobile based on the first parameter value, the second parameter value, and an automobile information model organizing the first parameterized automobile component and the second parameterized automobile component in a hierarchical design structure based on the structural relationship and one or more functional relationships between behaviors of the first instance and behaviors of the second instance;

modify an item included in the automobile information model;

automatically propagate the modification throughout the CAD geometry model to generate a modified CAD geometry model; and in response to generating the modified CAD geometry model, executing a functional simulation on a first simulation mesh in order to regenerate the one or more functional relationships between the behaviors of the first instance and the behaviors of the second instance.

* * * * *